United States Patent [19]
Sonnenberg et al.

[11] Patent Number: 6,036,835
[45] Date of Patent: Mar. 14, 2000

[54] METHOD OF MICROETCHING A CONDUCTIVE POLYMER ON MULTILAYER CIRCUIT BOARDS

[75] Inventors: Wade Sonnenberg, Upton; John J. Bladon; David Oglesby, both of Marlborough, all of Mass.; Jeffrey P. Burress, Bristow, Va.

[73] Assignee: Shipley Company, L.L.C., Marlborough, Mass.

[21] Appl. No.: 08/936,300

[22] Filed: Sep. 24, 1997

[51] Int. Cl.⁷ ............................... C25D 5/02; H05K 3/00
[52] U.S. Cl. .................. 205/125; 205/183; 205/210; 205/917
[58] Field of Search ..................... 205/223, 210, 205/131, 159, 164, 187, 125, 221, 183, 917

[56] References Cited

U.S. PATENT DOCUMENTS

| | | |
|---|---|---|
| 3,434,889 | 3/1969 | Haroldson et al. . |
| 3,537,895 | 11/1970 | Lancy . |
| 3,556,883 | 1/1971 | Naito et al. . |
| 3,702,273 | 11/1972 | Johnston, II . |
| 5,238,550 | 8/1993 | Burress ................................. 205/187 |
| 5,788,830 | 8/1998 | Sakamoto et al. ..................... 205/183 |

OTHER PUBLICATIONS

Moenes. Elias, "Update on Peroxide/Sulfuric Acid Etching", *Plating and Surface Finishing*, pp. 70–73, Jul. 1984.

*Primary Examiner*—Kathryn Gorgos
*Assistant Examiner*—Wesley A. Nicolas
*Attorney, Agent, or Firm*—Peter F. Corless; Darryl P. Frickey; S. Matthew Cairns

[57] ABSTRACT

A microetch composition for a circuit board containing sulfuric acid in combination with a carboxylic acid having 2 to 6 carbon atoms, wherein the volume of the carboxylic acid is preferably greater than the amount of sulfuric acid. The method discloses the contacting of a electrically conductive polymer with the microetch composition disclosed above to expose copper underlying the electrically conductive polymer.

11 Claims, 1 Drawing Sheet

METHOD OF MICROETCHING A CONDUCTIVE POLYMER ON MULTILAYER CIRCUIT BOARDS

BACKGROUND OF THE INVENTION

This invention is directed to a new and improved microetch formulation (composition) which is particularly suited for use in connection with the electroplating of through holes interconnecting the various metal layers of a multilayer circuit board.

Multiple layer copper clad circuit boards are used in constructing many electronic products. These circuit boards typically are copper cladding layers formed into various circuit configurations separated by dielectric material layers. In order to interconnect the copper layers, through holes are provided which extend between the layers. The through holes are electroplated with copper in order to form a conductive pathway between the copper clad layers. In order to facilitate electroplating of the through holes, a thin layer of the conductive polymer has been used see U.S. Pat. Nos. 5,528,000 and 5,415,762 (the entire contents of these patents are incorporated herein by reference hereto). The aforementioned patents should also be referred to for a description of the art. The composition herein is also usable in the direct plate processes such as palladium sulfide, palladium thiosulfate and carbon based direct plate processes (also see e.g., U.S. Pat. No. 4,810,333 which is incorporated herein by reference hereto for a direct plate process). In some processes, etchants have been used to remove the conductive coating, e.g. a conductive polymer positioned over the conductive copper cladding without removing the conductive polymer layer from the dielectric extending into the hole to expose the clad copper layers prior to electroplating. Such processes have used microetchant compositions which are based among other things on sulfuric acid and hydrogen peroxide combinations, see Printed Circuits Handbook, 4th Edition, Clyde Combs Edition McGraw-Hill © 1996, Chapter 21, 4, Etching Solutions and in particular Chapter Section 21, 4,2 Sulfuric acid—Hydrogen Peroxide Etchant Systems (the entire contents of this chapter are incorporated herein by reference hereto). While this has helped, it has been found that the post bonding separation (interconnect defects) e.g. poor bonding of the deposited copper to the copper cladding, has to be reduced even further to enhance quality.

It has now been found that a new and improved microetch formulations of this invention and the method of use thereof will unexpectedly increase the capability of the etchant to remove the conductive polymer over the copper cladding leaving a surface which permits better bonding of the subsequently electroplated copper to the exposed copper cladding.

In this way, it is now possible to provide circuit boards having substantially fewer interconnect defects due to poor bonding between the copper cladding of the circuits extending to the hole side surface and the electroless deposited copper.

BRIEF SUMMARY OF THE DISCLOSURE

This invention is directed to a new and improved microetch composition for etching away a conductive polymer to get cleaner copper surfaces of circuits extending into holes of a multilayer circuit board so that greatly improved bond strength is achieved after electroplating the through hole with copper. In order to achieve this result, it has been found that the addition of major amount of carboxylic acids containing 2 to 6 carbon atoms preferably aliphatic and most preferably acetic acid, to a sulfuric acid and hydrogen peroxide combination microetchants will produce the improved results. It is not known why the addition of a carboxylic acid containing 2 to 6 carbon atoms, and preferably acetic acid produces the improved results. However, it is known by experimentation that increases in the amount of sulfuric acid will not substantially improve the removal (cleaning) of the copper circuit layers on the interior of the hole. In addition, the use of additional sulfuric acid also reduces the pot life of the etchant thereby increasing processing costs.

DETAILED DESCRIPTION OF THE INVENTION

Figure 1:
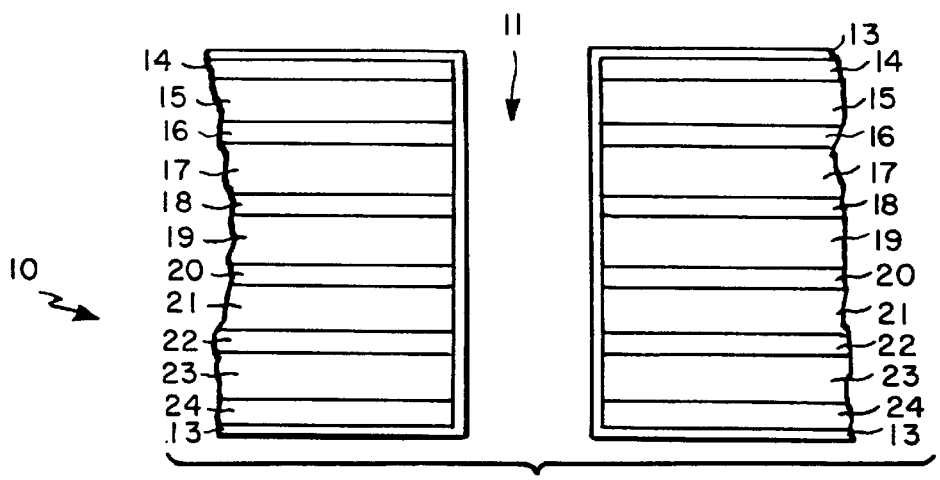
FIG. 1 is an enlarged sectional drawing of a portion of a multilayer printed circuit board to illustrate the method of the invention.

Reference should now be had to FIG. 1 for a detailed explanation of the method of this invention. In this figure, there is shown a typical portion of multilayer circuit board 10 at its conventional processing stage wherein a through hole or via 11 has been drilled or punched to leave wall 1 1a between the copper clad top layer circuit 14 and the bottom copper clad bottom layer circuit 24 and which is also conventionally coated with a thin electrically conductive film 13. Typically, the conductive film 13 is of a few angstroms in thickness to 0.0001 inches in thickness. The conductive film is applied in order to perform electroplating of the through hole wall 11a so there is a complete circuit. Between the top and bottom layers there are typical electrically nonconductive (dielectric) layers 15, 17, 19 21 and 23 having sandwiched therebetween and bonded thereto copper clad circuit layers 16, 18, 20 and 22.

As set forth in U.S. Pat. No. 5,415,762, the conductive polymer film 13 may be a polymerized pyrrole (See col. 2, 3, 4 and 5 of U.S. Pat. No. 5,415,762). Films formed of other materials as described in this U.S. Pat. No. 5,415,762 are also used.

The conductive polymer layer 13 is thoroughly dried in a forced hot air oven e.g., at 185° F. for ten minutes to remove the solvents therein.

At this point in the process, a microetchant composition of this invention is applied to the conductive film 13 in order to substantially and preferentially remove the film 13 overlying the copper cladding side edges 14a, 16a, 18a, 20a, 22a and 24 as well as remove the conductive film over the top of the copper cladding 14 and 24.

In the past, aqueous sulfuric acid-hydrogen peroxide based microetchant (unmodified) has been used to perform the microetching procedure, however it has been found that with the prior art etchant, difficulties arose in obtaining good bonding, i.e., adsorption of the copper from an electroplating process copper bath on the cladding of the copper circuits which were positioned further into the hole 11 and away from the top and bottom copper layers 14 and 24. For example, interconnect defects tended to be more pronounced at copper layer side surfaces 18a and 20a then at copper layer side surface 16a and 22a and more pronounced between copper layer side surface edges 16a and 22a in comparison with copper side surfaces 14a and 24a. With the use of the new microetchant composition of this invention, it has been found for some unknown reason, the inner copper side surfaces 18a and 20a as well as surfaces 16a and 22a can be electroplated with copper to substantially improve bonding strengths then had been achieved using primarily an aqueous sulfuric acid- hydrogen peroxide based microetch.

Figure 2:
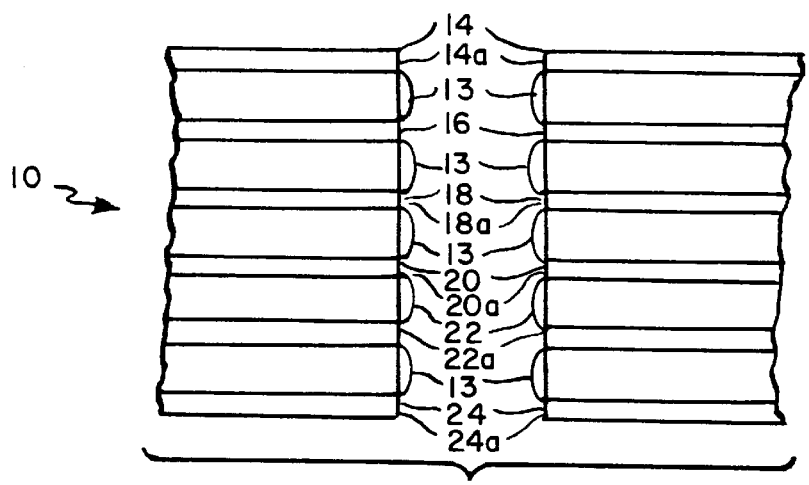
FIG. 2 is an enlarged drawing of the circuit board of FIG. 1 after it is etched according to the method of this invention.
Figure 3:
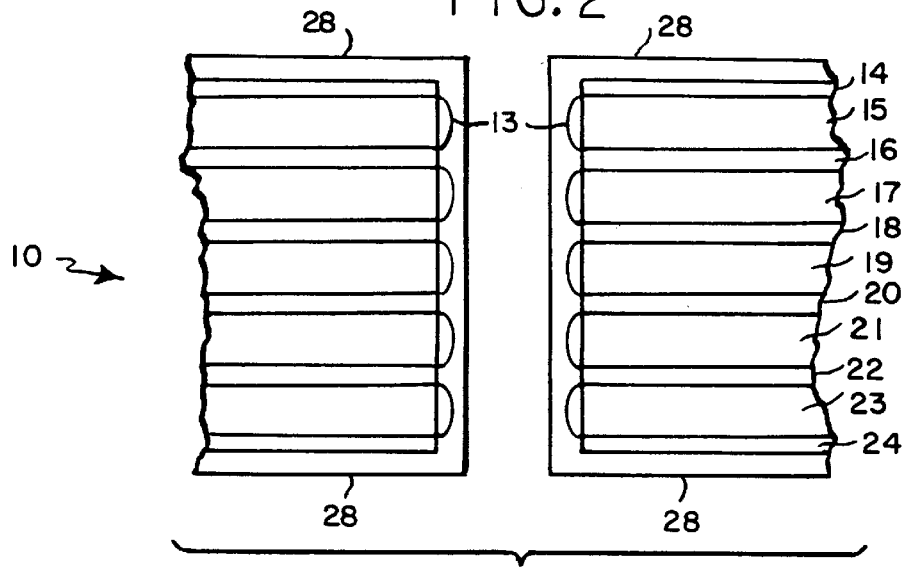
FIG. 3 is an enlarged view of the circuit board of FIG. 2 after it is electroplated according to the method of the invention.

In FIG. 2, it is noted that the new microetch will still leave enough of the conductive polymer 13 to contact the copper layers or leave small enough gaps which are bridged so that there is still a complete circuit when used as taught in this invention during electroplating. Thereafter, the board 10 as modified in FIG. 2 is then electroplated with copper to form a layer 28 (see FIG. 3) as taught in the aforementioned U.S. Pat. Nos. 5,528,000 or 5,415,762.

In this way, the through hole side wall surfaces is covered with an interconnecting copper conductor layer 28.

Further processing as desired may be done as well known in the art if desired by the manufacturer.

The new improved aqueous microetch formulation typically contains by volume the following:

1 to 10% hydrogen peroxide 5 to 20% sulfuric acid; and 1 to 30% weak carboxylic acid as defined herein (preferably over 99% pure e.g., acetic acid) with the remainder primarily water, e.g., 20% to 100%.

It is preferred that the carboxylic acid, e.g., acetic acid be between 5 to 22% by volume, more preferably 18 to 20% in volume, and most preferably 20% in volume.

In addition to the above, the etchant typically may include additives such as para toluene sulfonic acid <1% by volume and chloride as HCl, e.g., less than 100 ppm to effect better processing as well as to preserve the properties of the etchant bath.

The most preferred composition for conductive polymer processes, i.e., where polypyrrole is the conductive polymer comprises 10% sulfuric acid and 20% acetic acid in the composition with 3.5% hydrogen peroxide, and 0.025% of 10% HCl also being preferably included. Other additives, e.g., copper sulfate stabilizers and other additives, e.g., as desired for processing may be included. The total of all additional additives may be from 1 to 15% of the etchant formulation.

We claim:

1. A method of forming a copper plated hole to interconnect copper layers in a multilayer circuit board, the circuit board comprising a plurality of copper layers separated by dielectric material layers, and the circuit board comprising at least one hole therein, the method comprising:
   (a) etching a conductive polymer coating with an etchant composition containing sulfuric acid and a carboxylic acid having 2 to 6 carbon atoms to remove conductive polymer over copper surfaces of the board and expose the copper, and
   (b) electroplating the circuit board to form a copper surface on walls of the hole covered by the conductive polymer and the exposed copper.

2. The method of claim 1 wherein the etchant composition contains from 1 to 30% by volume of the carboxylic acid.

3. The method of claim 1 wherein etchant composition further contains hydrogen peroxide.

4. The method of claim 1 wherein the conductive polymer is a polymerized pyrrole.

5. A method of forming a copper plated hole to interconnect copper layers in a multilayer circuit board, the circuit board comprising a plurality of copper layers separated by dielectric material layers, and the circuit board comprising at least one hole therein, the method comprising:
   (a) etching a conductive polymer coating with an aqueous etchant composition to remove conductive polymer over copper surfaces of the board and expose the copper, the aqueous etchant composition containing 1) 5 to 20% sulfuric acid by volume, 2) 1 to 30% by volume of a carboxylic acid having 2 to 6 carbon atoms, and 3) hydrogen peroxide; and
   (b) electroplating the circuit board to form a copper surface on walls of the hole covered by the conductive polymer and the exposed copper.

6. The method of claim 5 wherein the carboxylic acid is acetic acid.

7. The method of claim 6 wherein the acetic acid is present in amount of from 5 to 22% by volume.

8. The method of claim 6 wherein the acetic acid is present in amount of about 20% by volume.

9. The method of claim 5 wherein the amount of sulfuric acid is about 10% by volume.

10. The method of claim 5 wherein the amount of hydrogen peroxide is 1 to 10% by volume.

11. The method of claim 5 wherein the conductive polymer is a polymerized pyrrole.

* * * * *